United States Patent [19]

Takikawa

[11] Patent Number: 5,170,230
[45] Date of Patent: Dec. 8, 1992

[54] SEMICONDUCTOR DEVICE AND PRODUCTION METHOD THEREOF

[75] Inventor: Masahiko Takikawa, Yokohama, Japan

[73] Assignee: Fujitsu Limited, Kawasaki, Japan

[21] Appl. No.: 521,404

[22] Filed: May 10, 1990

[30] Foreign Application Priority Data

May 10, 1989 [JP] Japan .................................. 1-115135

[51] Int. Cl.⁵ .................. H01L 29/80; H01L 29/161; H01L 29/12
[52] U.S. Cl. .................................. 257/195; 257/194; 257/201
[58] Field of Search .................. 357/22 A, 22 MD, 16, 357/61, 4, 58, 47

[56] References Cited

U.S. PATENT DOCUMENTS 4,733,283  3/1988  Kuroda ........................... 357/22 A
4,764,796  8/1988  Sasaki et al. ..................... 357/22 A

FOREIGN PATENT DOCUMENTS

0264932  4/1988  European Pat. Off. .......... 357/22 A
59-100576  6/1984  Japan ............................. 357/22 MD
60-37784   2/1985  Japan ............................. 357/22 MD
63-17563   1/1988  Japan ............................. 357/22 A
1-41272    2/1989  Japan ............................. 357/22 A Primary Examiner—Jerome Jackson, Jr.
Assistant Examiner—Ngan Van Ngo
Attorney, Agent, or Firm—Staas & Halsey

[57] ABSTRACT

A semiconductor device includes an InP substrate, an intrinsic InGaAs channel layer formed on the InP substrate and lattice matched to the InP substrate, a doped GaAsSb carrier supply layer formed on the intrinsic InGaAs channel layer and lattice matched to the InP substrate, a gate electrode formed on the doped GaAsSb carrier supply layer, and a source electrode and a drain electrode which are respectively formed on the doped GaAsSb carrier supply layer and located on both sides of the gate electrode.

9 Claims, 9 Drawing Sheets

SEMICONDUCTOR DEVICE AND PRODUCTION METHOD THEREOF

BACKGROUND OF THE INVENTION

The present invention generally relates to semiconductor devices and production methods thereof, and more particularly to a semiconductor device having a selectively doped heterostructure and a method of producing such a semiconductor device.

Generally, a semiconductor device which can operate at a high speed has a heterostructure using AlGaAs/GaAs. The GaAs layer functions as a channel layer. But since the carrier mobility within the GaAs layer is small, the improvement of the characteristics of the semiconductor device is limited thereby.

A high electron mobility transistor (hereinafter simply referred to as a HEMT) is known as one kind of semiconductor device which can operate at a high speed. In order to improve the carrier mobility in the HEMT, it is conceivable to use an InP substrate and form a heterojunction using a compound semiconductor which has a high carrier mobility compared to that of GaAs and is lattice matched to the InP substrate. In other words, an intrinsic InGaAs layer which is lattice matched to the InP substrate is used as the channel layer. Conventionally, AlGaAs is used for a carrier supply layer but the characteristic thereof is unstable due to the charging and discharging carriers caused by the DX center, and in order to avoid this problem, it is conceivable to use an InGaP layer which is lattice matched to GaAs as the carrier supply layer.

Figure 1:
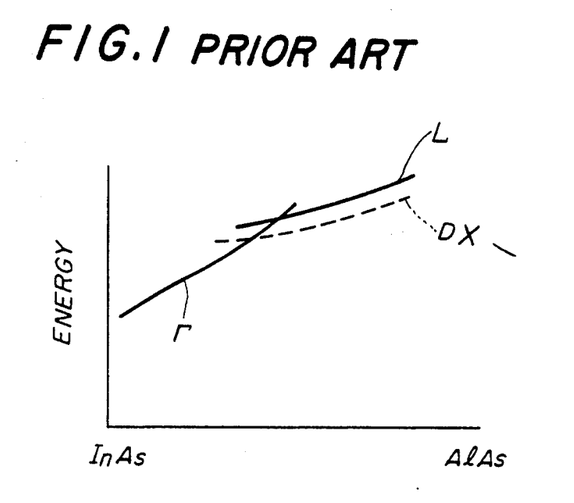
FIG. 1 shows a band of AlInAs.

As described above, when the InGaAs channel layer is lattice matched to the InP substrate, an AlInAs layer or an InP layer may be used as the carrier supply layer. However, AlInAs includes a DX center and it is known that it is difficult to generate a Schottky junction with InP. In other words, a trap is formed by the DX center as shown in FIG. 1 which shows a band of the AlInAs. In addition, a forbidden band is generated in the current-voltage characteristic. Moreover, the biggest problem is that InGaAs, AlInAs or InP which makes the lattice matching with InP cannot be etched by a selective dry etching using a gas mixture of $CCl_2F_2$ and He as the etching gas. For these reasons, it is impossible to produce an enhancement/depletion type HEMT which is a basis of semiconductor integrated circuit devices.

Figure 2:
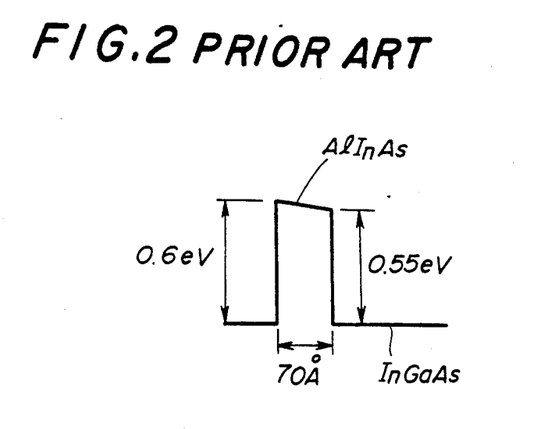
FIG. 2 shows a band structure of a AlInAs/InGaAs heterojunction.

On the other hand, FIG. 2 shows a band structure of the AlInAs/InGaAs heterojunction when the carrier supply layer is made of AlInAs with an impurity density of $1.5 \times 10^{18}$ $cm^{-3}$. There is a potential difference of 0.55 eV between the conduction bands of AlInAs and InGaAs layers, and a potential difference of 0.6 eV between the conduction bands of the AlInAs layer and the gate which form a Schottky junction. In order to make an enhancement type HEMT in this case, the AlInAs carrier supply layer must have an extremely small thickness in the order of 70 Å. But when the AlInAs carrier supply layer has such a small thickness, the two-dimensional electron gas characteristic of the HEMT is easily deteriorated by the damage caused by a dry etching. On the other hand, when the impurity density is decreased for the purpose of allowing for a thicker AlInAs carrier supply layer, it becomes difficult to obtain an ohmic contact and it is difficult to obtain a two-dimensional electron gas channel on the drain side. Therefore, it is impossible make an efficient enhancement/depletion type HEMT due to the band structure of the AlInAs/InGaAs heterojunction.

SUMMARY OF THE INVENTION

Accordingly, it is a general object of the present invention to provide a novel and useful semiconductor device and production method thereof, in which the problems described above are eliminated.

Another and more specific object of the present invention is to provide a semiconductor device comprising an InP substrate, an intrinsic InGaAs channel layer formed on the InP substrate and lattice matched to the InP substrate, a doped GaAsSb carrier supply layer formed on the intrinsic InGaAs channel layer and lattice matched to the InP substrate, where the doped GaAsSb carrier supply layer makes contact with the intrinsic InGaAs channel layer, a gate electrode formed on the doped GaAsSb carrier supply layer, and a source electrode and a drain electrode which are respectively formed on the doped GaAsSb carrier supply layer and located on both sides of the gate electrode. According to the semiconductor device of the present invention, it is possible to easily realize a high-speed semiconductor device having satisfactory characteristics.

Still another object of the present invention is to provide a semiconductor device comprising an InP substrate, an intrinsic InGaAs channel layer formed on the InP substrate and lattice matched to the InP substrate, a first doped GaAsSb carrier supply layer formed on the intrinsic InGaAs channel layer and lattice matched to the InP substrate, an etching stopper layer formed on the first doped GaAsSb carrier supply layer, a second doped GaAsSb carrier supply layer formed on the etching stopper layer, at least a first gate electrode formed on the second doped GaAsSb carrier supply layer, and a first source electrode and a first drain electrode which are respectively formed on the second doped GaAsSb carrier supply layer and located on both sides of the first gate electrode. According to the semiconductor device of the present invention, it is possible to easily realize a high-speed semiconductor device having satisfactory characteristics. In addition, it is possible to realize enhancement/depletion type high-speed semiconductor devices.

Still another object of the present invention is to provide a method of producing a semiconductor device comprising the steps of preparing a stacked structure having an InP substrate, an intrinsic channel layer formed on the InP substrate, a first doped GaAsSb carrier supply layer formed on the intrinsic channel layer, an etching stopper layer formed on the first doped GaAsSb carrier supply layer, and a second doped GaAsSb carrier supply layer formed on the etching stopper layer, forming an isolation region which extends from a surface of the second doped GaAsSb carrier supply layer to the intrinsic channel layer, the isolation region isolating the semiconductor device into first and second device regions, forming first and second source electrodes, first and second drain electrodes and a first gate electrode on the second doped GaAsSb carrier supply layer, the first source electrode, the first drain electrode and the first gate electrode being formed in the first device region, selectively etching the second doped GaAsSb carrier supply layer to form an opening which extends from the surface of the second doped GaAsSb carrier supply layer to a surface of the etching stopper layer, the etching stopper layer having an etching rate which is small compared to an etching rate of the second doped GaAsSb carrier supply layer, and forming a second gate electrode on the etching stopper layer within the opening, the second source electrode, the second drain electrode and the second gate electrode being formed in the second device region. According to the method of the present invention, it is possible to easily realize enhancement/depletion type high-speed semiconductor devices.

Other objects and further features of the present invention will be apparent from the following detailed description when read in conjunction with the accompanying drawings.

DESCRIPTION OF THE PREFERRED EMBODIMENTS

Figure 3:
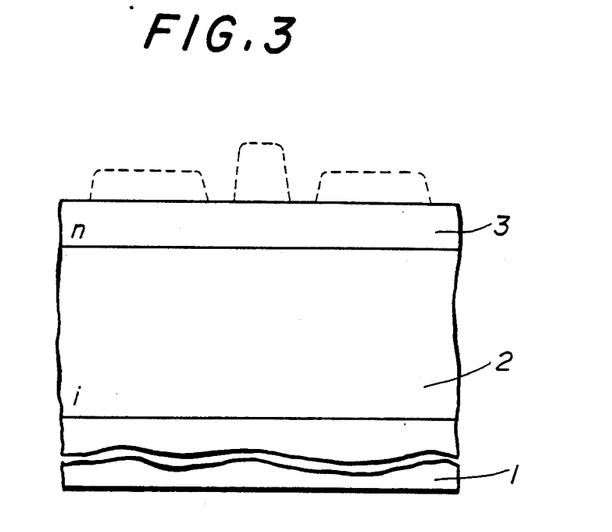
FIGS. 3 and 4 are cross sectional views of an essential part of a semiconductor device according to the present invention for explaining the operating principle of the present invention.

First, a description will be given of the operating principle of a semiconductor device according to the present invention, by referring to FIGS. 3 and 4. FIG. 3 shows a semiconductor layer structure suited for forming a normal HEMT, and FIG. 4 shows a semiconductor layer structure suited for forming an enhancement/depletion type HEMT.

The semiconductor layer structure shown in FIG. 3 includes a semi-insulative InP substrate 1, an intrinsic InGaAs channel layer 2, and an n-type GaAsSb carrier supply layer 3. On the other hand, the semiconductor layer structure shown in FIG. 4 includes the semi-insulative InP substrate 1, the intrinsic InGaAs channel layer 2, an n-type GaAsSb carrier supply layer 3', an n-type AlInAs etching stopper layer 4, and an n-type GaAsSb carrier supply layer 5. For example, InP or InGaAs may be used in place of AlInAs for the etching stopper layer 4. The etching stopper layer 4 enables a selective dry etching using a gas mixture of $CCl_2F_2$ and He as the etching gas.

Figure 4:
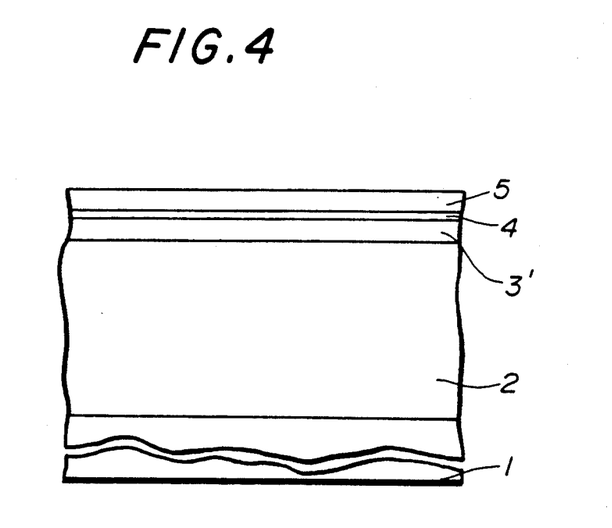

For example, the layer structures shown in FIGS. 3 and 4 are formed as follows. That is, the channel layer 2 has a thickness of 6000 Å. The carrier supply layer 3 has a thickness of 300 Å and an impurity density of $1.5 \times 10^{18}$ cm$^{-3}$. The carrier supply layer 3, has a thickness of 200 Å and an impurity density of $1.5 \times 10^{18}$ cm$^{-3}$. The etching stopper layer 4 has a thickness of 20 Å and an impurity density of $1.5 \times 10^{18}$ cm$^{-3}$. The carrier supply layer 5 has a thickness of 100 Å and an impurity density of $1.5 \times 10^{18}$ cm$^{-3}$.

According to the semiconductor layer structures shown in FIGS. 3 and 4, InGaAs which is used for the channel layer 2 makes a lattice matching with InP which is used for the substrate 1, and GaAsSb which is used for the carrier supply layers 3, 3' and 5 make a lattice matching with InP which is used for the substrate 1. Furthermore, InP, AlInAs or InGaAs which is used for the etching stopper layer 4 also makes a lattice matching with InP which is used for the substrate 1. In a best mode of the present invention, the etching stopper layer 4 is made of InP.

Accordingly, it is possible to easily realize a semiconductor device which has a satisfactory characteristic by using as the channel layer 2 InGaAs which makes a lattice matching with the InP substrate 1. In addition, by combining with the GaAsSb carrier supply layer 3 or 3' the etching stopper layer 4 which is made of InP, InGaAs or AlInAs which is lattice matched to the InP substrate 1, it is possible to easily produce the enhancement/depletion type semiconductor device.

When no lattice matching is required, it is possible to use AlInGaAs, AlGaAs, InGaP and the like for the etching stopper layer 4. In this case, the thickness of the etching stopper layer 4 may be 20 Å, for example.

Figure 5:
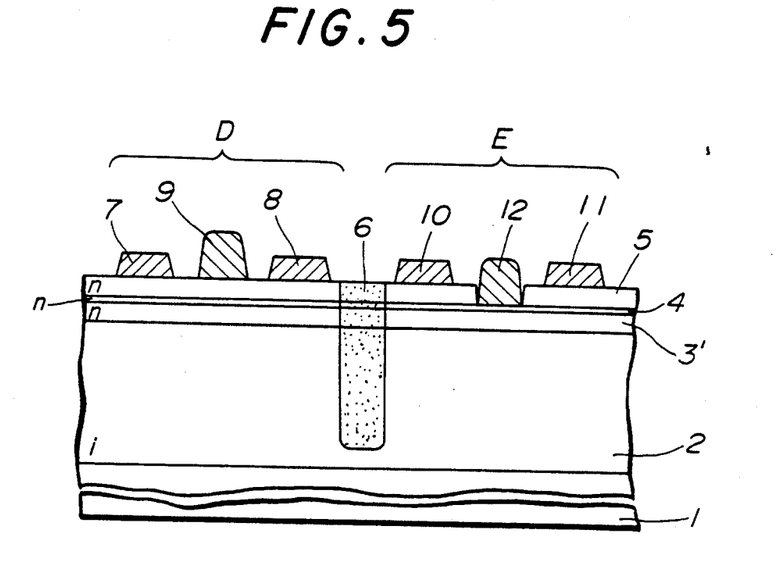
FIG. 5 is a cross sectional view showing an essential part of an embodiment of the semiconductor device according to the present invention.

FIG. 5 shows an essential part of an embodiment of the semiconductor device according to the present invention. In this embodiment, the present invention is applied to the enhancement/depletion type HEMT. In FIG. 5, those parts which are essentially the same as those corresponding parts in FIGS. 3 and 4 are designated by the same reference numerals, and a description thereof will be omitted.

The HEMT shown in FIG. 5 includes an isolation region 6, a source electrode 7 of a depletion type transistor portion, a drain electrode 8 of the depletion type transistor portion, a gate electrode 9 of the depletion type transistor portion, a source electrode 10 of an enhancement type transistor portion, a drain electrode 11 of the enhancement type transistor portion, and a gate electrode 12 of the enhancement type transistor portion. The depletion type transistor portion is indicated by D, and the enhancement type transistor portion is indicated by E.

Next, a description will be given of an embodiment of a method of producing the semiconductor device according to the present invention, by referring to FIGS. 6 through 13 and 15. In this embodiment, it is assumed for the sake of convenience that the HEMT shown in FIG. 5 is produced. In FIGS. 6 through 13 and 15, those parts which are the same as those corresponding parts in FIG. 5 are designated by the same reference numerals.

Figure 6:
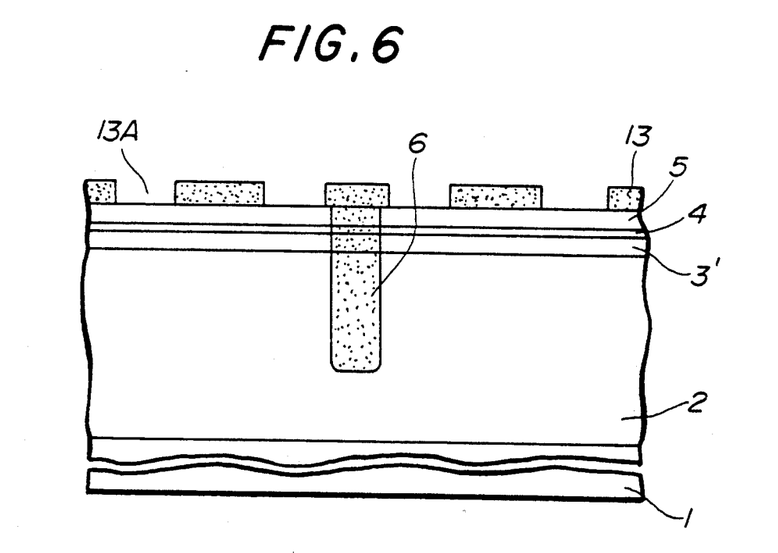
FIGS. 6 through 13 and 15 are cross sectional views for explaining an embodiment of a method of producing the semiconductor device according to the present invention.

In FIG. 6, metal organic chemical vapor deposition (MOCVD) techniques are used for successively forming the intrinsic InGaAs channel layer 2, the n-type GaAsSb carrier supply layer 3', the n-type AlInAs etching stopper layer 4 and the n-type GaAsSb carrier supply layer 5 on the semi-insulative InP substrate 1.

Trimethyl gallium (TMG: $(CH_3)_3Ga$), trimethyl indium (TMI: $(CH_3)_3In$) and arsine ($AsH_3$) are used for form the channel layer 2.

TMG, $AsH_3$ and trimethyl antimony (TMSb: $(CH_3)_3SB$) are used and monosilane ($SiH_4$) is used as the dopant when forming the carrier supply layers 3' and 5.

Trimethyl aluminum (TMA: $(CH_3)_3Al$), TMI and $AsH_3$ are used and $SiH_4$ is used as the dopant when forming the etching stopper layer 4.

An ion implantation technique is used to selectively implant oxygen ions to form the isolation region 6.

A photoresist layer 13 having openings 13A is formed on the carrier supply layer 5 using the resist process of the known photolithography technique. The openings 13A are formed at portions where the source electrodes and the drain electrodes are to be formed at a latter stage.

Figure 7:
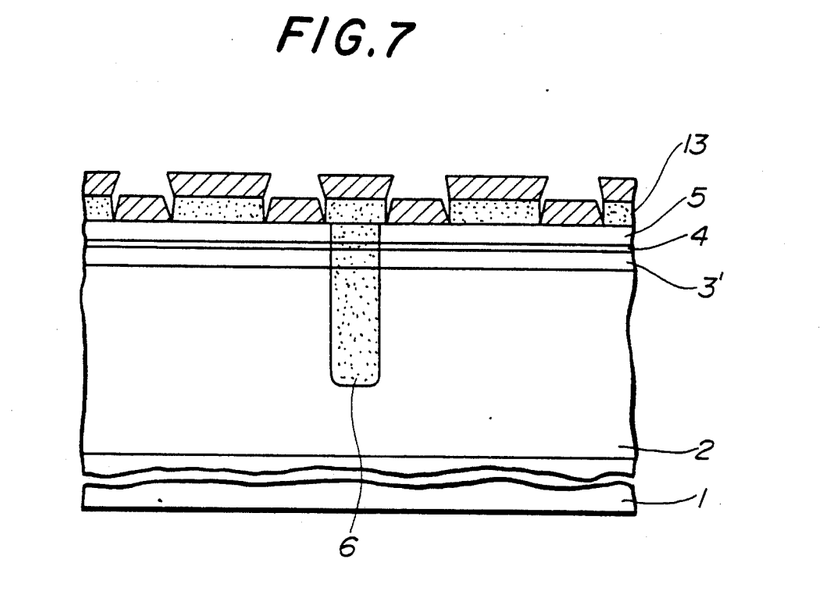

Then, in FIG. 7, a vacuum deposition technique is used to successively form a AuGe layer having a thickness of 500 Å and a Au layer having a thickness of 3000 Å, for example.

Figure 8:
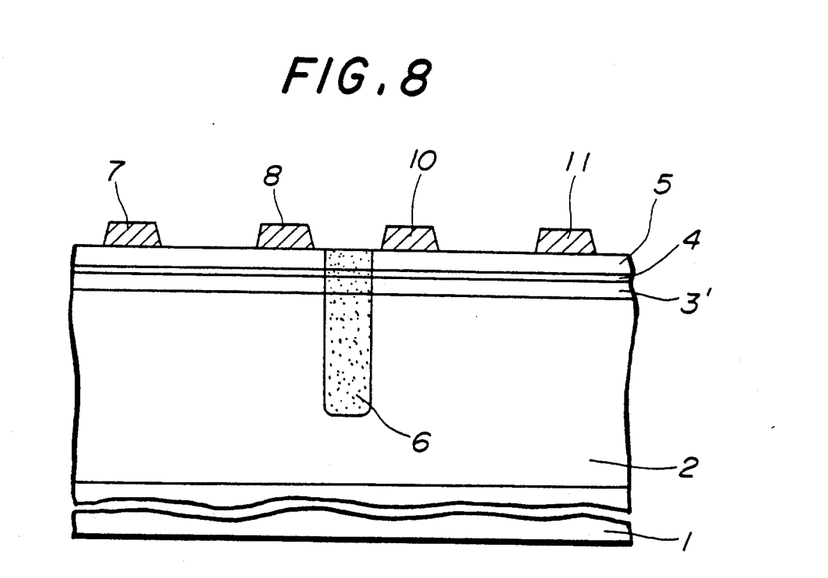

In FIG. 8, the photoresist layer 13 is removed by submerging the structure shown in FIG. 7 into acetone, for example. As a result, the AuGe layer and the Au layer are patterned by the so-called lift-off process, thereby forming the source electrode 7, the drain electrode 8, the source electrode 10 and the drain electrode 11.

An alloying thermal process is carried out in a nitrogen atmosphere at a temperature of approximately 450° for 5 minutes, for example.

Figure 9:
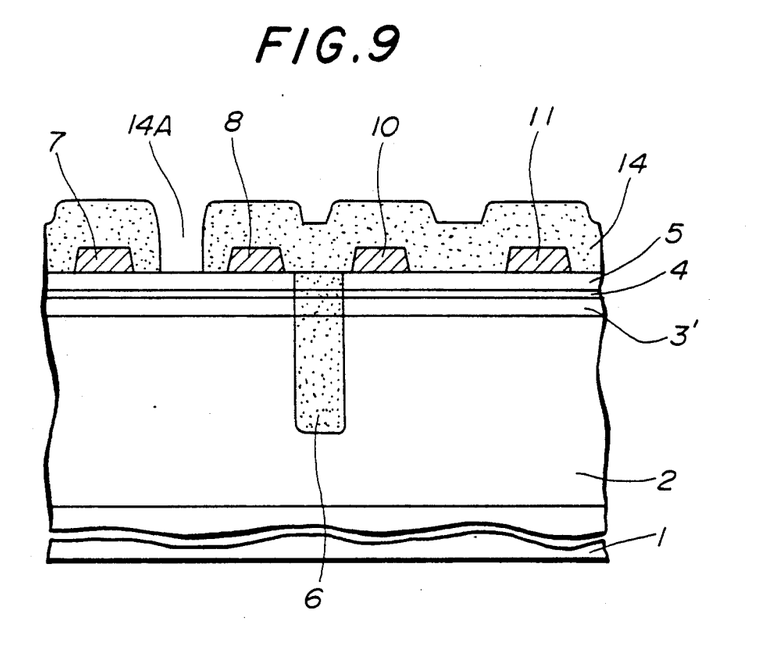

In FIG. 9, a photoresist layer 14 having an opening 14A is formed on the carrier supply layer 5 using the resist process of the known photolithography technique. The opening 14A is formed at a portion where the gate electrode is to be formed at a latter stage.

Figure 10:
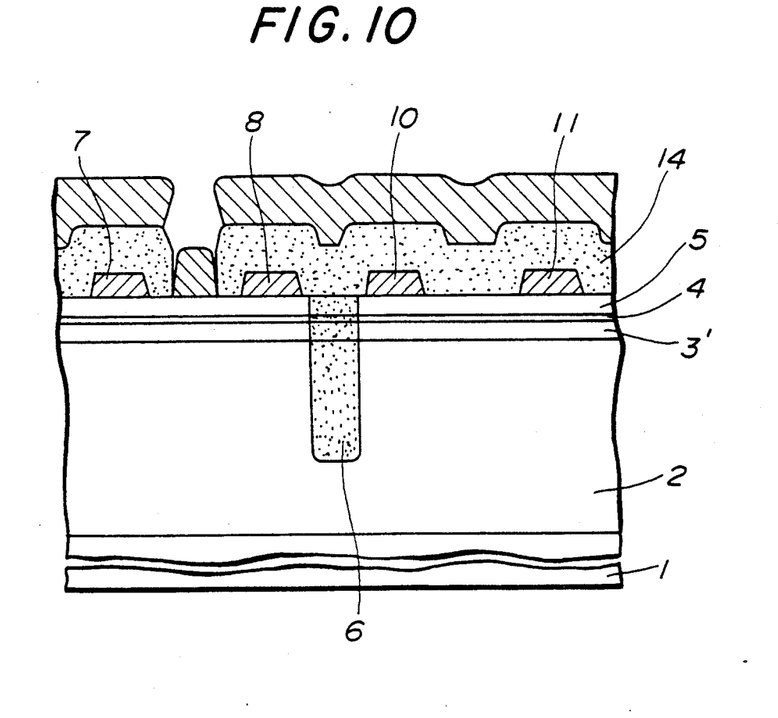

Then, in FIG. 10, a vacuum deposition technique is used to form an Al layer having a thickness of 3000 Å, for example.

Figure 11:
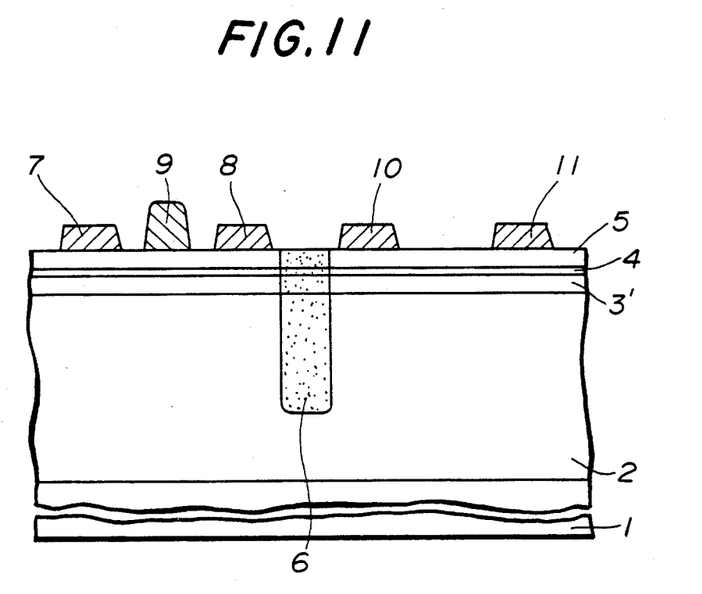

In FIG. 11, the photoresist layer 14 is removed by submerging the structure shown in FIG. 10 into acetone, for example. As a result, the Al layer is patterned by the so-called lift-off, thereby forming the gate electrode 9 of the depletion type HEMT.

Figure 12:
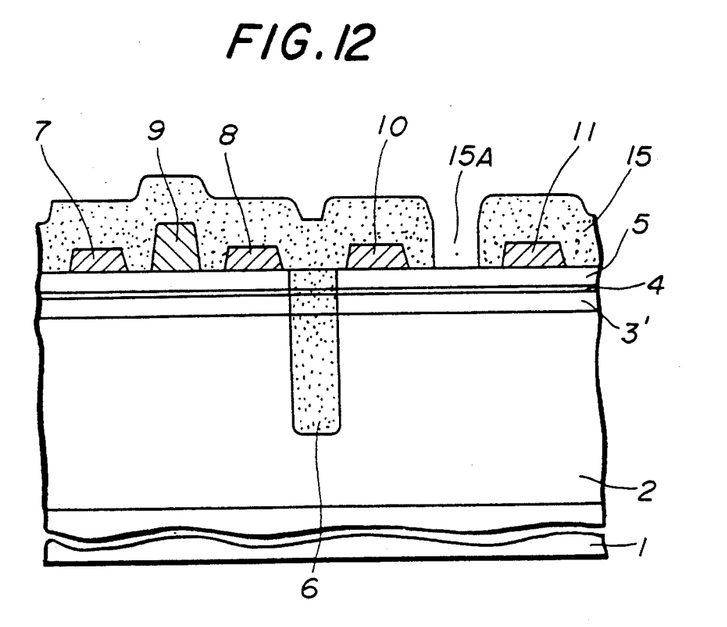

In FIG. 12, a photoresist layer 15 having an opening 15A is formed on the carrier supply layer 5 using the resist process of the known photolithography technique. The opening 15A is formed at a portion where the gate electrode is to be formed at a latter stage.

Figure 13:
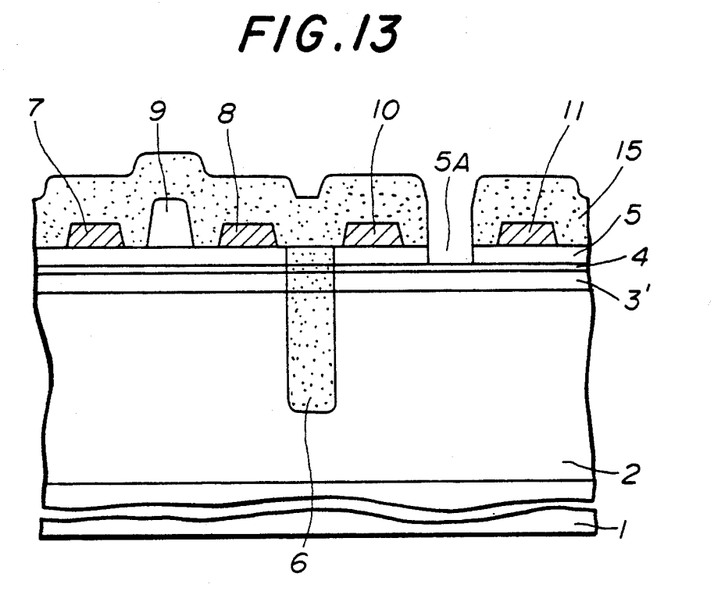

Then, in FIG. 13, a plasma etching step using a gas mixture of $CCl_2F_2$ and He as the etching gas is made to selectively etch the n-type GaAsSb carrier supply layer 5, so that an opening 5A is formed. This opening 5A is formed from the surface of the n-type GaAsSb carrier supply layer 5 and reaches the surface of the n-type AlInAs etching stopper layer 4. In this case, the etching by the $CCl_2F_2$ and He plasma is made for approximately 5 seconds.

Figure 14:
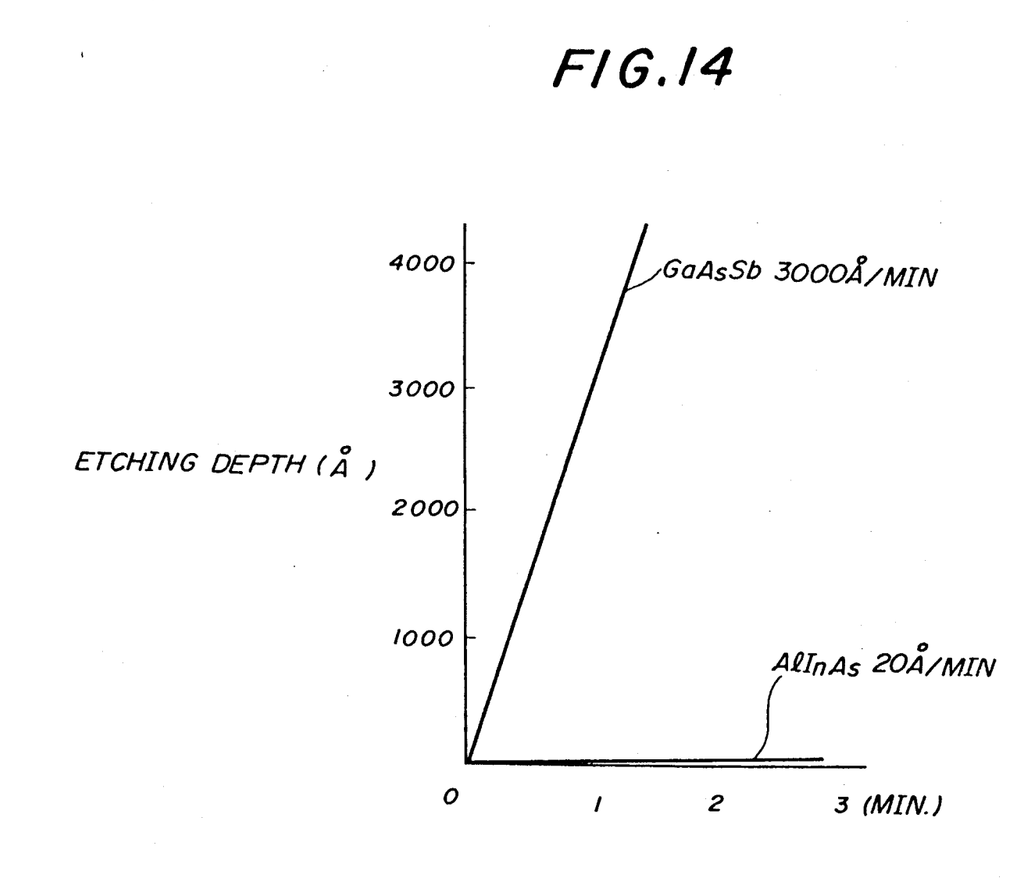
FIG. 14 is a graph for explaining the etching rates of GaAsSb and AlInAs in $CCl_2F_2$ and He plasma.

FIG. 14 shows the etching rates of GaAsSb and AlInAs when the $CCl_2F_2$ and He plasma is used for the etching. The ordinate indicates the time in minutes and the abscissa indicates the etching depth in Å. As is evident from FIG. 14, the etching rate of GaAsSb is 3000 Å/min while the etching rate of AlInAs is only 20 Å/min and small compared to the etching rate of GaAsSb, Then, in FIG. 15, a vacuum deposition technique is used to form an Al layer having a thickness of 3000 Å, for example.

Figure 15:
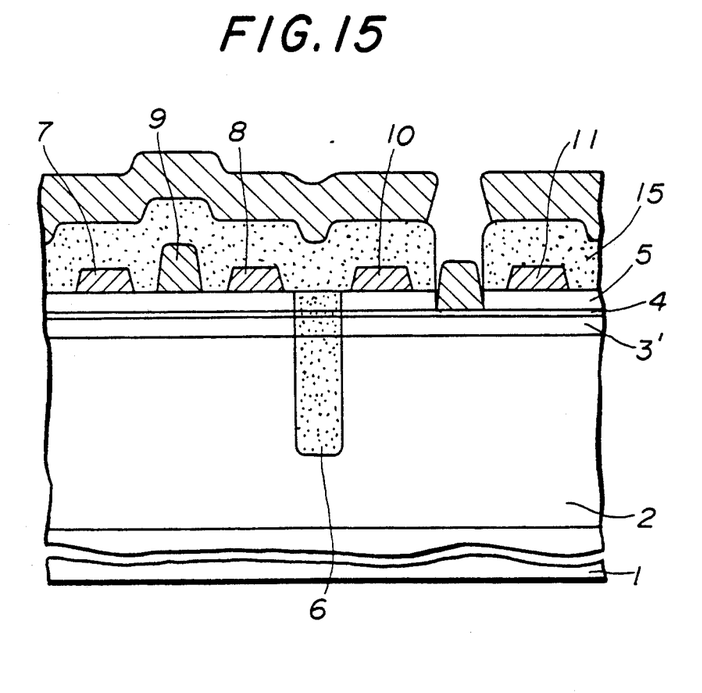

Next, the photoresist layer 15 is removed by submerging the structure shown in FIG. 15 into acetone, for example. As a result, the Al layer is patterned by the so-called lift-off process, thereby forming the gate electrode 12 of the enhancement type HEMT. Finally, the HEMT shown in FIG. 5 is produced.

Figure 16:
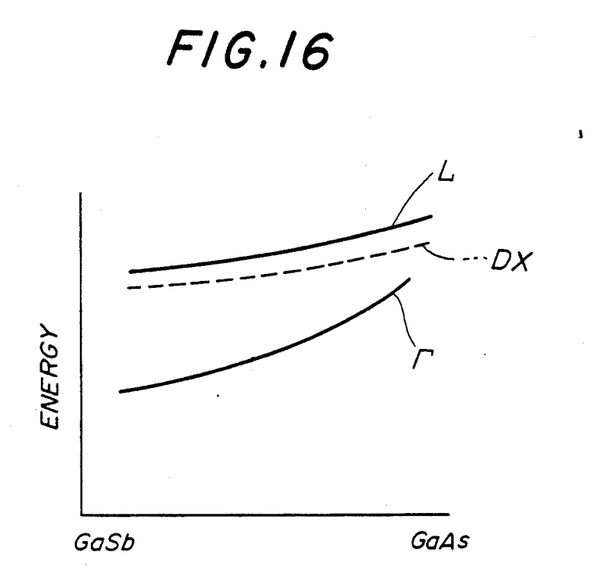
FIG. 16 shows a band of GaAsSb for explaining the effects of the present invention.

FIG. 16 shows a band of GaAsSb. It may be seen that the Γ band is considerably lower than the L band, and no trap is generated by the DX center.

Figure 17:
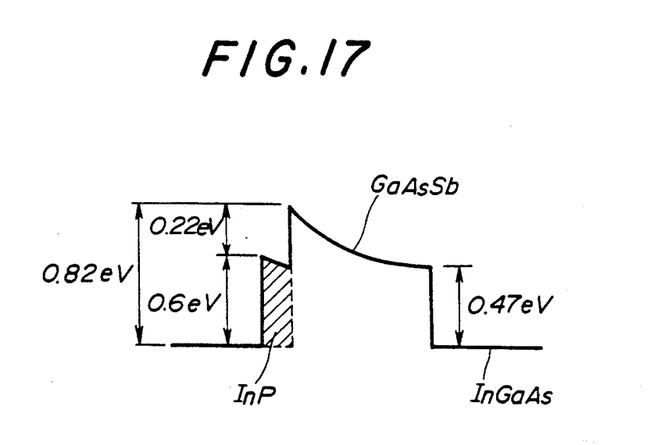
FIG. 17 shows a band structure of a GaAsSb/InGaAs heterojunction for explaining the effects of the present invention.

FIG. 17 shows a band structure of the GaAsSb/InGaAs/heterojunction when the carrier supply layer is made of GaAsSb. The potential difference between the conduction bands of the GaAsSb and InGaAs layers is 0.47 eV. The potential difference between the conduction bands of the InP etching stopper layer and the gate is 0.6 eV and there is an offset of 0.22 eV, and there is a potential difference of 0.82 eV in total. Hence, the GaAsSb carrier supply layer with an impurity density of $1.5 \times 10^{18}$ cm$^{-3}$ need not be made extremely thin and may be in the range of 200 to 300 Å, for example, and there is no need to set the impurity density to a low value. As a reuslt, the HEMT which is produced according to the present invention is virtually unaffected by the short-channel effect.

Further, the present invention is not limited to these embodiments, but various variations and modifications may be made without departing from the scope of the present invention.

What is claimed is:

1. A semiconductor device comprising:
   an InP substrate;
   an intrinsic InGaAs channel layer formed on said InP substrate and lattice matched to said InP substrate;
   a first doped GaAs Sb carrier supply layer formed on said intrinsic InGaAs channel layer and lattice matched to said InP substrate;
   an etching stopper layer formed on said first doped GaAsSb carrier supply layer;
   a second doped GaAsSb carrier supply layer formed on said etching stopper layer;
   a first gate electrode having first and second opposite sides, and formed on said second doped GaAsSb carrier supply layer and defining corresponding first and second portions of said doped GaAsSb carrier supply layer; and
   a first source electrode and a first drain electrode which are respectively formed on said first and second portions of said second doped GaAsSb carrier supply layer and located adjacent said first and second opposite sides of said first gate electrode.

2. The semiconductor device as claimed in claim 1, further comprising:
   a second gate electrode having first and second opposite sides, and formed on said etching stopper layer;
   a second source electrode and a second drain electrode respectively formed on said second doped GaAsSb carrier supply layer and located adjacent said first and second opposite sides of said second electrode; and
   an isolation region which isolates first and second regions, said first region including a depletion type high electron mobility transistor having said first gate electrode, and said first source electrode and said first drain electrode, and said second region including an enhancement type high electron mobility transistor having said second gate electrode, said second source electrode and said second drain electrode.

3. The semiconductor device as claimed in claim 1 wherein said first and second doped GaAsSb carrier supply layers are made of n-type GaAsSb, and said etching stopper layer is made of an n-type material.

4. The semiconductor device as claimed in claim 1 wherein said etching stopper layer has a thickness of approximately 20 Å and an impurity density of approximately $1.5 \times 10^{18}$ cm$^{-3}$.

5. The semiconductor device as claimed in claim 4 wherein said etching stopper layer is made of a material such that said etching stopper layer is lattice matched to said InP substrate.

6. The semiconductor device as claaimed in claim 5, wherein said etching stopper layer is made of a material selected from the group consisting of AlInAs, InP and InGaAs.

7. The semiconductor device as claimed in claim 4 wherein said etching stopper layer is made of a material such that said etching stopper layer is not lattice matched to said InP substrate.

8. The semiconductor device as claimed in claim 7 wherein said etching stopper layer is made of a material selected from a group including AlInGaAs, AlGaAs and InGaP.

9. The semiconductor device as claimed in claim 4 wherein said first and second doped GaAsSb carrier supply layers respectively have a thickness in a range of approximately 200 to 300 Å and an impurity density of approximately $1.5 \times 10^{\sim} cm^{-3}$.

* * * * *

UNITED STATES PATENT AND TRADEMARK OFFICE
CERTIFICATE OF CORRECTION

PATENT NO. : 5,170,230
DATED : December 8, 1992
INVENTOR(S) : Masahiko TAKIKAWA

It is certified that error appears in the above-indentified patent and that said Letters Patent is hereby corrected as shown below:

Title Page:
Under item [56] References Cited - FOREIGN PATENT DOCUMENTS: please add the following references:

-- 
| | | |
|---|---|---|
| 1182930 | 2/1985 | Canada |
| 0050064 | 4/1982 | European Pat. Off. |
| 0119089 | 9/1984 | European Pat. Off. |
| 0171531 | 2/1986 | European Pat. Off. |
| 0175437 | 3/1986 | European Pat. Off. |
| 0244304 | 4/1987 | European Pat. Off. |

OTHER PUBLICATIONS

SUGIYAMA et al., "Conduction-Band Edge Discontinuity of InGaAs/GaAsSb Heterostructures Lattice-Matched to InP Grown by Molecular Beam Epitaxy," *JOURNAL OF CRYSTAL GROWTH*, Vol. 956, Nos. 1-4, Feb. 1989, Amsterdam, NL, pages 363-366.   --

Col. 6, line 55, delete "and" (first occurrence).

Signed and Sealed this

Seventeenth Day of May, 1994

Attest:

BRUCE LEHMAN

*Attesting Officer*   *Commissioner of Patents and Trademarks*